(12) United States Patent
Matsumoto et al.

(10) Patent No.: US 9,551,735 B2
(45) Date of Patent: Jan. 24, 2017

(54) SENSOR DEVICE WITH SERIES CIRCUIT OF MOS SWITCH AND CAPACITOR

(71) Applicant: Hitachi Automotive Systems, Ltd., Hitachinaka-shi, Ibaraki (JP)

(72) Inventors: Masahiro Matsumoto, Tokyo (JP); Hiroshi Nakano, Tokyo (JP); Keiji Hanzawa, Hitachinaka (JP); Satoshi Asano, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 154 days.

(21) Appl. No.: 14/416,306

(22) PCT Filed: Jun. 26, 2013

(86) PCT No.: PCT/JP2013/067431
§ 371 (c)(1),
(2) Date: Jan. 22, 2015

(87) PCT Pub. No.: WO2014/017240
PCT Pub. Date: Jan. 30, 2014

(65) Prior Publication Data
US 2015/0260765 A1    Sep. 17, 2015

(30) Foreign Application Priority Data

Jul. 25, 2012 (JP) ................. 2012-164295

(51) Int. Cl.
*G01R 31/40* (2014.01)
*G01R 19/165* (2006.01)
(Continued)

(52) U.S. Cl.
CPC ........... *G01R 19/16538* (2013.01); *G01L 9/00* (2013.01); *G01L 19/12* (2013.01); *G01L 27/007* (2013.01);
(Continued)

(58) Field of Classification Search
CPC .............. G01R 31/2829; G01R 19/165; G01R 19/16538; G01L 27/007; G01D 3/08
See application file for complete search history.

(56) References Cited

U.S. PATENT DOCUMENTS

| | | | |
|---|---|---|---|
| 6,401,018 B1 * | 6/2002 | Oba | G01R 31/2829 327/20 |
| 6,657,423 B2 * | 12/2003 | Tanizawa | G01R 31/2829 324/522 |
| 2004/0189480 A1 | 9/2004 | Imai et al. | |

FOREIGN PATENT DOCUMENTS

JP    2001-165817 A    6/2001
JP    2004-294069 A    10/2004

OTHER PUBLICATIONS

International Search Report (PCT/ISA/210) dated Aug. 6, 2013 with English-language translation (Two (2) pages).

* cited by examiner

*Primary Examiner* — Minh N Tang
(74) *Attorney, Agent, or Firm* — Crowell & Moring LLP

(57) ABSTRACT

In a related art sensor device, an output voltage of the sensor device is fixed not to a power supply voltage or a ground potential but to an intermediate potential upon disconnection of a power supply line or a ground line. A sensor device 1 is composed of: a detection element 8 whose voltage Vsen changes depending on a detected physical quantity; an output circuit configured by MOS switches 4 to 6, 7, 9, 10 and 12 to 17, capacitors 2, 11 and 18, an operational amplifier 19, a reference voltage source 20, and output NMOS transistor 21; a series circuit of the MOS switch 4 and the capacitor 2, the series circuit being arranged in a negative feedback part of the output circuit; and a diode 3 that connects a well electrode of the MOS switch 4 and a power supply terminal Vcc.

8 Claims, 4 Drawing Sheets

(51) Int. Cl.
*G01R 31/28* (2006.01)
*G01L 27/00* (2006.01)
*G01L 9/00* (2006.01)
*G01L 19/12* (2006.01)

(52) U.S. Cl.
CPC ......... G01R 19/165 (2013.01); G01R 31/2829 (2013.01)

Prior Art

SENSOR DEVICE WITH SERIES CIRCUIT OF MOS SWITCH AND CAPACITOR

TECHNICAL FIELD

The present invention relates to a sensor device, and particularly to a sensor device that fixes an output voltage to a power supply voltage or a ground potential at the time of power supply disconnection.

BACKGROUND ART

Examples of conventional sensor devices include a physical quantity sensor device described in JP-2004-294069-A (Patent Document 1), etc.

The related art described in Patent Document 1 is configured in such a manner that disconnection of a power supply line or its contact failure is detected by a reduction in power supply voltage, and a sensor output is fixed to the potential of the power supply line by turning off an output transistor when the power supply voltage decreases. This makes it possible to make a judgment as to failures such as the disconnection of the power supply line and its contact failure.

PRIOR ART DOCUMENT

Patent Document

Patent Document 1: JP-2004-294069-A

SUMMARY OF INVENTION

Problems to be Solved by the Invention

The above related art lacks attention to the application to a resistance type detection element and a CMOS process integrated circuit.

FIG. 3 illustrates a configuration where the above related art is applied to a resistance type detection element. In the present configuration, power is supplied via a power supply line 37 and a ground line 39 from a control device 40 to a sensor device 28, and a sensor output voltage therefrom is transmitted to the control device 40 via an output line 38. A constant voltage source 41 which supplies a constant voltage to the sensor device 28, and a pull-up resistor 42 connected between the output line 38 and the constant voltage source 41 are disposed in the control device 40. A resistance type detection element 29 is disposed in the sensor device 28 and has resistors 30 and 31 whose resistance values change depending on a detected physical quantity. A voltage Vsen of the detection element 29 varies depending on the detected physical quantity. The voltage Vsen is amplified by an output circuit constituted of resistors 32 and 33, an amplifier 34, a reference power supply 35, and an output transistor 36 and outputted to the control device 40 through an output terminal Vout and the output line 38. When the power supply line 37 is disconnected in the present configuration, the voltage of the output terminal Vout is determined by a voltage divided by the resistors 31, 32 and 33 and the pull-up resistor 42. That is, the voltage of the output terminal Vout is not fixed to a power supply voltage or a ground potential, but results in an intermediate potential (voltage range in which the sensor device outputs the same when it is normal). When the voltage of the output terminal Vout is fixed to the power supply voltage or the ground potential, the control device 40 is capable of determining that the sensor device 28 has failed. In the configuration of FIG. 3, however, when the power supply line 37 is disconnected, the voltage of the output terminal Vout becomes the intermediate potential without being fixed to the power supply voltage or the ground potential. There is therefore a possibility that it will not be possible to detect the disconnection of the power supply line 37. That is, in the present configuration, inconvenience occurs where the detection element 28 is of a resistance type detection element.

FIG. 4 illustrates a configuration where a CMOS amplifier circuit 43 is connected to the fore stage of the configuration shown in FIG. 3. Incidentally, FIG. 4 shows only a PMOS transistor 44 and an NMOS transistor 45 provided in an output stage with respect to the internal configuration of the CMOS amplifier circuit 43. When the power supply line 37 is disconnected in the present configuration, the voltage of the constant voltage source 41 is supplied from the pull-up resistor 42, the resistor 33, the resistor 32 and a drain electrode of the PMOS transistor 44 to a power supply terminal Vcc via a well electrode thereof, so that power is supplied to the sensor device 28. This power is high in resistance as a power supply because it flows through the pull-up resistor 42, the resistor 33 and the resistor 32, and a voltage drop across a PN junction occurs because it flows via the well electrode from the drain electrode of the PMOS transistor 44. Therefore, incomplete power is supplied to the sensor device 28, thus causing an incomplete voltage to occur in the voltage of the output terminal Vout. That is, in the present configuration, when the power supply line 37 is disconnected, the voltage of the output terminal Vout is not fixed to the power supply voltage or the ground potential and becomes an incomplete voltage (voltage having a very large error within a range of voltages that the sensor device outputs when it is normal). There is therefore a possibility that it will not possible to detect the disconnection of the power supply line 37.

The present invention has been made in view of the above circumstances. An object of the present invention is to provide a sensor device capable of securely fixing an output voltage of the sensor device to a power supply voltage or a ground potential when a power supply line is disconnected.

Means for Solving the Problems

In order to solve the above problems, the present invention is provided in which a series circuit of a MOS switch and a capacitor is arranged in a negative feedback part of an output circuit for generating a sensor output voltage, and an element acting as a diode is connected to a well electrode of the MOS switch.

Effects of Invention

According to the present invention, when a power supply line or a ground line of a sensor device is disconnected, an output voltage of the sensor device can be securely fixed to a power supply or a ground potential. Therefore, since a control device using the present sensor device is capable of detecting a failure in the present sensor device, it is possible to secure fail safe of a control system using the present sensor device.

MODE FOR CARRYING OUT THE INVENTION

Embodiments of the present invention will hereinafter be described with reference to the drawings.

Figure 1:
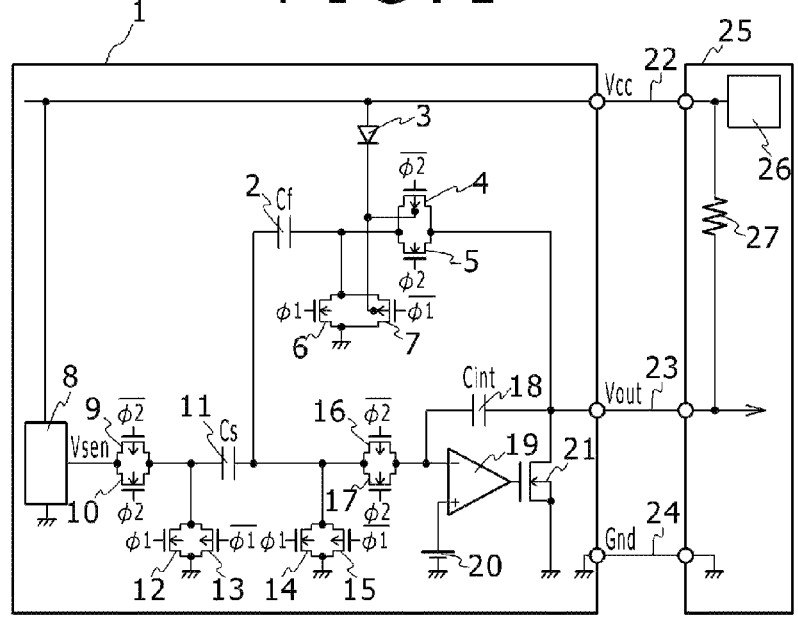
FIG. 1 illustrates a circuit configuration of a sensor device of a first embodiment.
Figure 2:
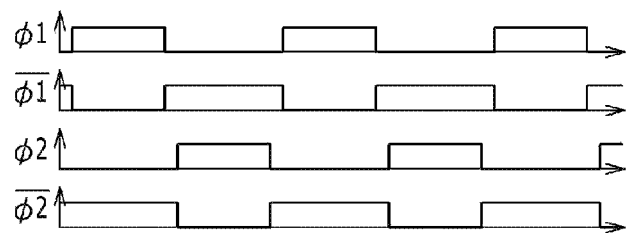
FIG. 2 is a timing chart of clock signals φ1 and φ2.
Figure 3:
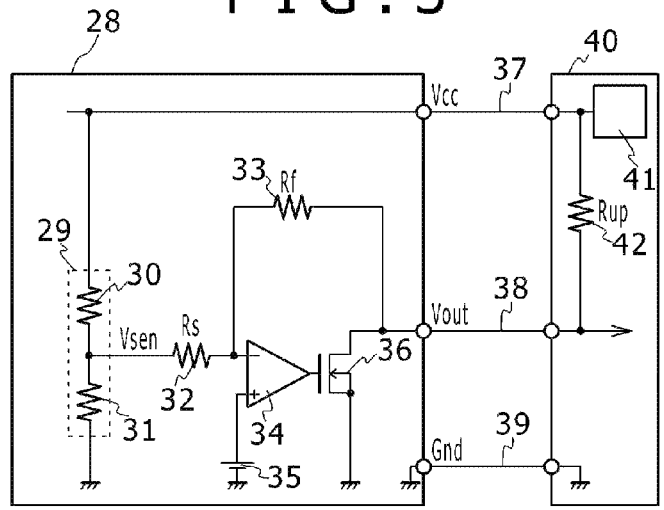
FIG. 3 illustrates a configuration where a related art is applied to a resistance type detection element.
Figure 4:
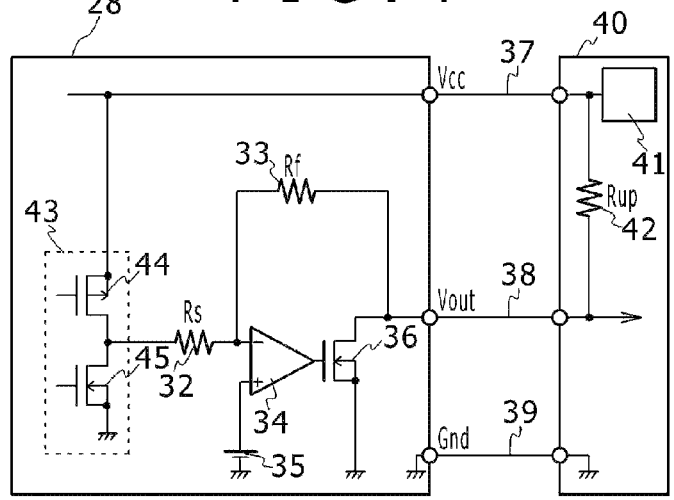
FIG. 4 illustrates a configuration where a CMOS amplifier circuit 43 is connected to the fore stage of the configuration shown in FIG. 3.

A sensor device showing a first embodiment of the present invention will first be described with reference to FIGS. 1 and 2. Incidentally, FIG. 1 illustrates a circuit configuration of the sensor device of the first embodiment, and FIG. 2 is a timing chart of clock signals $\phi 1$ and $\phi 2$.

In the sensor device 1 of the present embodiment, power is supplied via a power supply line 22 and a ground line 24 from a control device 25 to a power supply terminal Vcc and a ground terminal Gnd of the sensor device 1. A sensor output voltage is sent via an output line 23 from an output terminal Vout to the control device 25. A constant voltage source 26 that supplies a constant voltage to the sensor device 1, and a pull-up resistor 27 connected between the output line 23 and the constant voltage source 26 are arranged in the control device 25. A detection element 8 is disposed in the sensor device 1, and a voltage Vsen therefrom varies depending on a detected physical quantity. Incidentally, a pressure sensor, an acceleration sensor, an angular velocity sensor, an air flow sensor, etc. are used as for the detection element 8. Also, an output circuit configured by MOS switches 4, 5, 6, 7, 9, 10, 12, 13, 14, 15, 16 and 17 controlled by the clock signals $\phi 1$ and $\phi 2$ shown in FIG. 2, capacitors 2, 11 and 18, an operational amplifier 19, a reference voltage source 20, and an SWC (Switched Capacitor) configured by an output NMOS transistor 21 amplifies the voltage Vsen and outputs the same to the control device 25 through the output terminal Vout and the output line 23. Further, in the present output circuit, a series circuit of the MOS switch 4 and the capacitor 2 is provided in a negative feedback part, and a well electrode of the MOS switch 4 is connected to the power supply terminal Vcc through a diode 3. Furthermore, a well electrode of the MOS switch 7 is also connected to the power supply terminal Vcc through the diode 3.

When the power supply line 22 is disconnected in the present embodiment, an electric current attempts to flow from the constant voltage source 26 through the pull-up resistor 27 and the output terminal Vout. Current paths considered in this case will be sequentially described.

First, the current path through which an electric current flows from the output terminal Vout to the capacitor 2 via the MOS switches 4 and 5 is cut off by the capacitor 2. Next, in the current path through which the electric current flows from the output terminal Vout to the power supply terminal Vcc through a drain (source) electrode of the MOS switch 4, the well electrode of the MOS switch 4, and the diode 3, the diode 3 takes the direction from the power supply terminal Vcc to the well electrode of the MOS switch 4 as a forward direction. Therefore, since the direction from the well electrode of the MOS switch 4 to the power supply terminal Vcc becomes reversed against the diode 3, the electric current is cut off.

Next, the current path through which an electric current flows from the output terminal Vout via the capacitor 18 is cut off by the capacitor 18. Next, in the current path through which the electric current flows to the power supply terminal Vcc through the MOS switches 4 and 5 from the output terminal Vout and through the diode 3 from the well electrode of the MOS switch 7, the electric current is cut off because the diode 3 is placed in a reverse direction.

Next, since the current path through which the electric current flows from the MOS switches 6 and 7 to the ground terminal Gnd through the MOS switches 4 and 5 from the output terminal Vout is controlled by the clock signals $\phi 1$ and $\phi 2$ shown in FIG. 2, either the MOS switches 4 and 5 or the MOS switches 6 and 7 always turn to an off state and hence the electric current is cut off. Incidentally, since the voltages of the clock signals $\phi 1$ and $\phi 2$ are also considered to be unstable when taking into consideration that power is not supplied normally, the electric current can be securely cut off by eliminating the MOS switch 7 in this case.

Next, in the current path through which an electric current flows from the output terminal Vout to the ground terminal Gnd through the output MOS transistor 21, the electric current is cut off since the output MOS transistor 21 becomes an off state in a state in which no power is supplied.

Thus, when the power supply line 22 is disconnected in the present configuration, no electric current flows from the constant voltage source 26 to the output terminal Vout through the pull-up resistor 27. That is, the voltage of the output terminal Vout is fixed to the voltage of the constant voltage source 26. In other words, the voltage can be fixed to the power supply voltage of the sensor device 1. Therefore, the control device 25 can determine that any failure has occurred in the sensor device 1 and take action depending on the failure. The control device 25 can be operated in a fail safe manner as a control system using the present sensor device 1.

Incidentally, in the sensor device 1 of the present embodiment, the configuration of the output circuit is made into an open-drain type circuit configuration based on the output MOS transistor 21. Thereby, it is possible to eliminate a PMOS transistor for an output transistor. If the PMOS transistor exists, a current path occurs in which the well electrode of the PMOS transistor is connected to the power supply terminal Vcc, and thereby an electric current attempts to flow from the constant voltage source 26 to the power supply terminal Vcc through the pull-up resistor 27 and the output terminal Vout when the power supply line 22 is broken. Since the PMOS transistor used as the output transistor performs an analog-like operation, it is so hard to eliminate the current paths from the output terminal Vout to the power supply terminal Vcc without impairing the analog-like operation. Although a description will be made later about an embodiment where the PMOS transistor is used as the output transistor even in the present invention, the current paths are eliminated at the sacrifice of the maximum amplitude. That is, it is possible to realize an improvement in circuit characteristics, circuit simplification, a reduction in chip size, etc. by providing the configuration of the output circuit as an open drain type.

Figure 5:
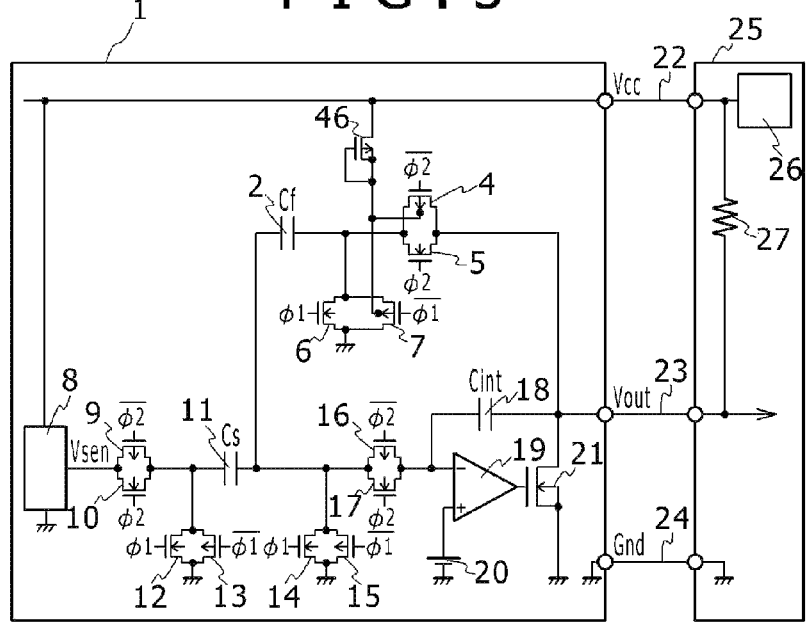
FIG. 5 illustrates a circuit configuration of a sensor device of a second embodiment.

Next, a sensor device showing a second embodiment of the present invention will be described with reference to FIGS. 5 and 6. Incidentally, FIG. 5 is a circuit configuration of the sensor device of the second embodiment, and FIG. 6 is a sectional structure of a PMOS transistor 46.

The sensor device of the second embodiment is basically identical in configuration to the sensor device of the first embodiment, but the following improvements are added thereto. In the present embodiment, the PMOS transistor 46 is provided instead of the diode 3. A source electrode 47 of the PMOS transistor 46 is connected to the power supply terminal Vcc, and a drain electrode 49, a well electrode 50 and a gate electrode 48 thereof are connected to the well electrodes of the MOS switches 4 and 7. By doing so, the diode element and the MOS transistor are substantially arranged in parallel between the power supply terminal Vcc and the well electrodes of the MOS switches 4 and 7. Thus, the well electrodes of the MOS switches 4 and 7 can be supplied with a more stable potential when power is being normally supplied to the power supply terminal Vcc.

Figure 6:
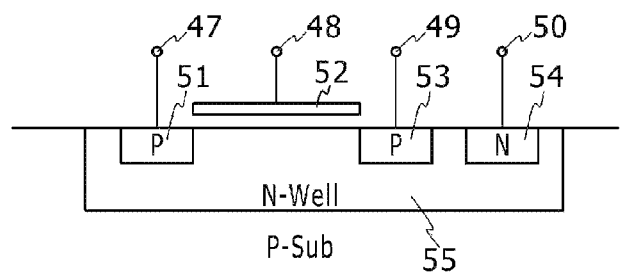
FIG. 6 illustrates a sectional structure of a PMOS transistor 46.

The sectional structure of the PMOS transistor 46 is illustrated in FIG. 6. The PMOS transistor 46 has a structure that an N well region 55 (N-Well) is provided in a P-type substrate (P-Sub), and P type regions 51 and 53 are provided in the N well region 55 (N-Well) to form a source region and a drain region, and that a gate 52 is disposed between the source region and the drain region. Also, a source electrode 47 is provided in the P type region 51, a drain electrode 49 is provided in the P type region 53, and the gate 52 is provided with a gate electrode 48. Further, an N type region 54 is provided in the N well region 55 (N-Well), and a well electrode 50 is disposed therein.

In the present embodiment, the source electrode 47 of the PMOS transistor 46 is connected to the power terminal Vcc, and the drain electrode 49, the well electrode 50 and the gate electrode 48 thereof are connected to the well electrodes of the MOS switches 4 and 7. Consequently, a diode element based on a PN junction by the P type region 51 and the N well region 55 is provided between the power supply terminal Vcc and the well electrodes of the MOS switches 4 and 7. Further, since the gate electrode 48 of the PMOS transistor 46 is connected to the well electrode sides of the MOS switches 4 and 7, the potential of the gate electrode 48 of the PMOS transistor 46 is also reduced when the potential of each of the well electrodes of the MOS switches 4 and 7 is low. Therefore, the PMOS transistor 46 is brought into an on state so that the potentials of the well electrodes of the MOS switches 4 and 7 are raised. This effect makes it possible to stabilize the potential of the gate electrode 48 of the PMOS transistor 46 at a higher speed.

Figure 7:
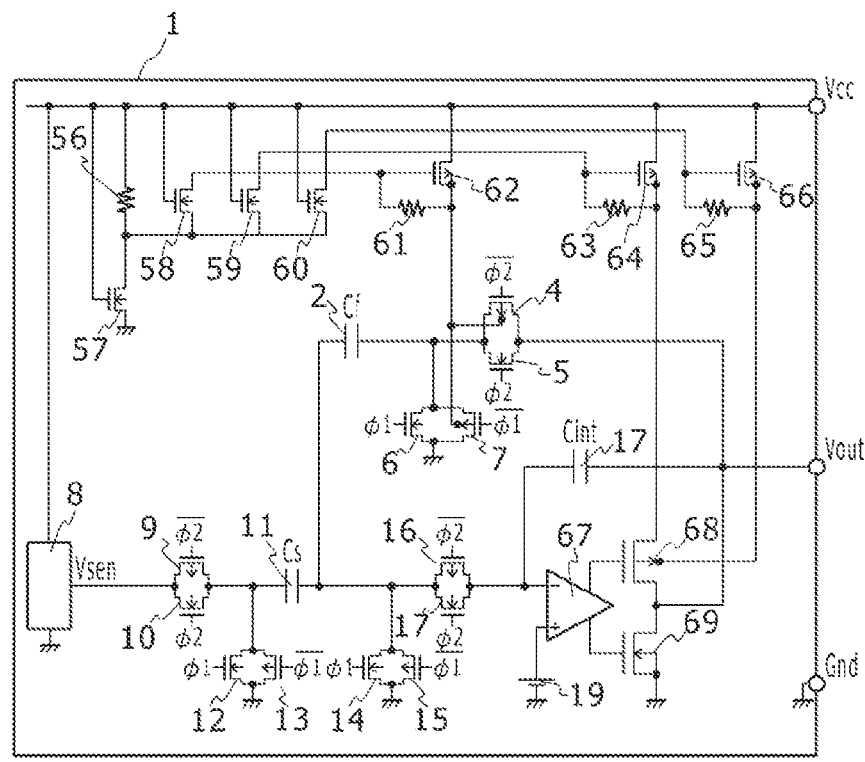
FIG. 7 illustrates a circuit configuration of a sensor device of a third embodiment.

A sensor device showing a third embodiment of the present invention will next be described with reference to FIG. 7. Incidentally, FIG. 7 is a circuit configuration of the sensor device of the third embodiment.

The sensor device of the third embodiment is basically identical in structure to the sensor device of the first embodiment, but the following improvements are added thereto. In the present embodiment, there are provided a resistor 56 and a MOS transistor 57 which reduces to a predetermined level the voltage between the power supply terminal Vcc and the ground terminal Gnd when the power supply terminal Vcc or the ground terminal Gnd are made open, MOS transistors 58, 59 and 60 turned on and off in response to the voltage level between the power terminal Vcc and the ground terminal Gnd, MOS transistors 62, 64 and 66 respectively controlled by turning on and off of the MOS transistors 58, 59 and 60, resistors 61, 63 and 65 respectively disposed between drain and gate electrodes of the MOS transistors 62, 64 and 66, an output PMOS transistor 68 and an output NMOS transistor 69 that drive the voltage of the output terminal Vout, and an operational amplifier 67 that controls the output PMOS transistor 68 and the output NMOS transistor 69.

In the sensor device of the present embodiment, when the power supply terminal Vcc or the ground terminal Gnd is made open, the voltage between the power supply terminal Vcc and the ground terminal Gnd is reduced to a predetermined voltage by the resistor 56 and the MOS transistor 57. Further, since the MOS transistors 58, 59 and 60 respectively have gate electrodes connected to the power supply terminal Vcc and source electrodes connected to one end of the resistor 56, they are respectively brought into an on state when the voltage between the power supply terminal Vcc and the ground terminal Gnd is normal and brought into an off state when the voltage between the power supply terminal Vcc and the ground terminal Gnd is reduced. Therefore, they serve as voltage detecting means for detecting that the voltage between the power supply terminal Vcc and the ground terminal Gnd is reduced. Furthermore, since the MOS transistors 62, 64 and 66 are turned on when the MOS transistors 58, 59 and 60 are respectively in the on state, the well electrodes of the MOS switches 4 and 7 and the source and well electrodes of the output PMOS transistor 68 are connected to the power supply terminal Vcc in such a manner that the voltage of the output terminal Vout is outputted normally. Incidentally, since the MOS transistor 64 is connected in series with the output PMOS transistor 68, the output amplitude is reduced if the size of the MOS transistor 64 is not set to a size sufficient therefor. Contrary to this, when the power supply terminal Vcc is placed to turn opened and thereby the MOS transistors 58, 59 and 60 are respectively brought into an off state, the MOS transistors 62, 64 and 66 respectively turn to an off state. Therefore, the well electrodes of the MOS switches 4 and 7, the source and well electrodes of the output PMOS transistor 68 are cut off from the power supply terminal Vcc. Incidentally, since the well electrodes of the MOS transistors 62, 64 and 66 are respectively connected to the drain electrodes of the MOS transistors 62, 64 and 66, a diode element having a forward direction from the power supply terminal Vcc to the well electrodes of the MOS transistors 4 and 7 is connected to the MOS transistor 62. A diode element having a forward direction from the power supply terminal Vcc to the source electrode of the output PMOS transistor 68 is connected to the MOS transistor 64. A diode element having a forward direction from the power supply terminal Vcc to the well electrode of the output PMOS transistor 68 is connected to the MOS transistor 66. Consequently, since the current path from the output terminal Vout to the power supply terminal Vcc is cut off, the voltage of the output terminal Vout is fixed to a power supply voltage. Therefore, the control device 25 is capable of determining that any failure occurs in the sensor device 1 and taking action depending on the failure. The control device 25 can be operated in a fail safe manner as a control system using the present sensor device 1.

Figure 8:
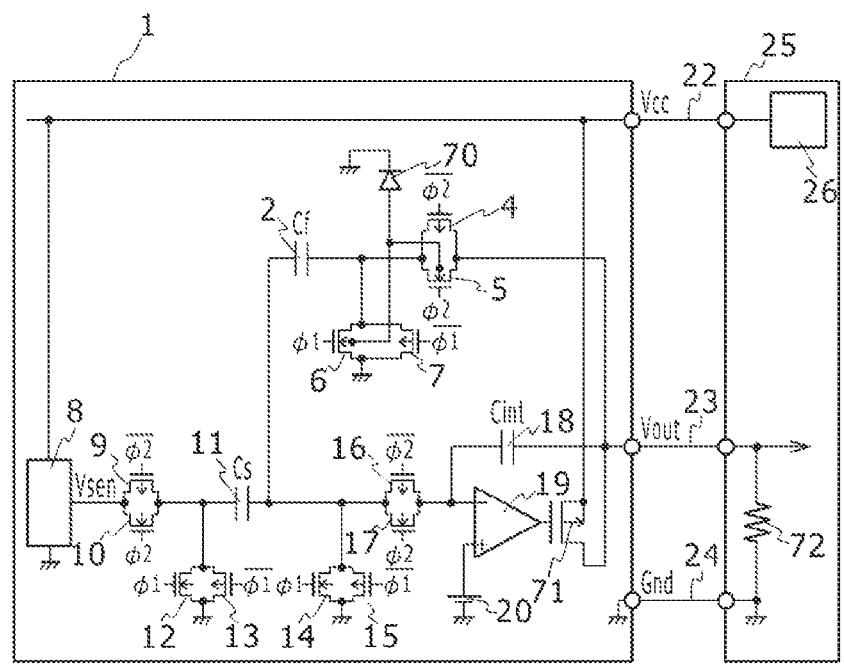
FIG. 8 illustrates a circuit configuration of a sensor device of a fourth embodiment.

A sensor device showing a fourth embodiment of the present invention will next be described with reference to FIG. 8. Incidentally, FIG. 8 is a circuit configuration of the sensor device of the fourth embodiment.

The sensor device of the fourth embodiment is basically identical in structure to the sensor device of the first embodiment, but the following improvements are added thereto. Although the first embodiment has assumed the CMOS process using the P-type substrate, the present embodiment has assumed a CMOS process using an N-type substrate. When the CMOS process using the N-type substrate is assumed, a well of an NMOS transistor can be separated, but a well of a PMOS transistor can not be separated. For this reason, a pull-down resistor 72 is arranged at the output terminal Vout. Further, an output PMOS transistor 71 is disposed in an output circuit due to the pull-down resistor 72. Furthermore, even relative to the diode 3, a diode 70 is arranged in such a manner as to take the direction from the MOS switches 5 and 6 to the ground terminal Gnd as a forward direction.

When the power supply line 22 is disconnected in the present embodiment, no electric current flows via the output terminal Vout because the pull-down resistor 72 is connected to the output terminal Vout. Therefore, the voltage of the output terminal Vout becomes a ground potential. Further, when the ground line 24 is broken, a series circuit of the MOS switch 5 and the capacitor 2 arranged in the negative feedback part of the output circuit is provided and a well electrode of the MOS switch 5 is provided with the diode 70 to thereby cut off an electric current flowing from the output terminal Vout to the ground terminal Gnd. By doing so, no electric current flows to the output terminal Vout when the ground line 24 is disconnected. It is therefore possible to fix the potential of the output terminal Vout to the ground potential.

Figure 9:
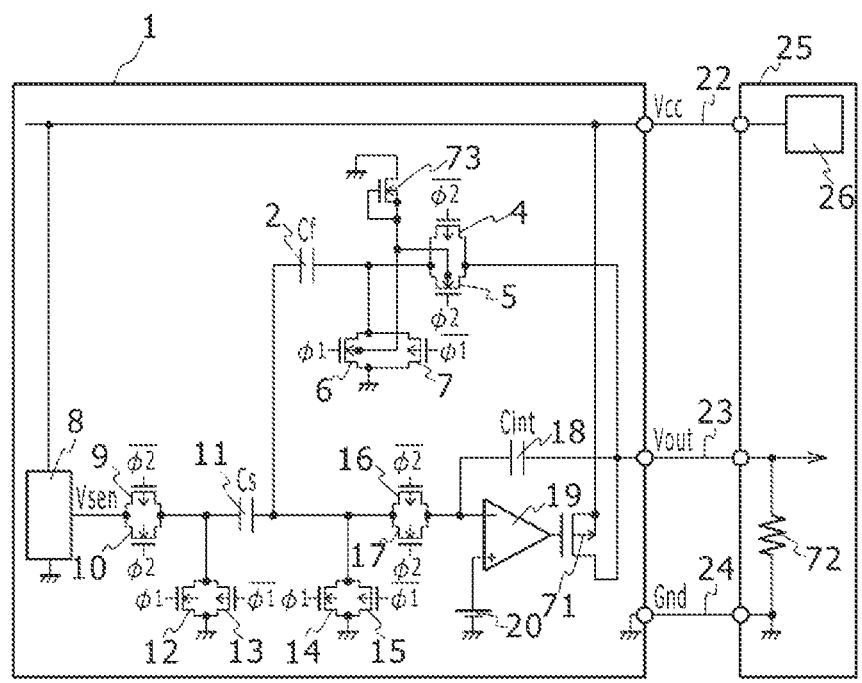
FIG. 9 illustrates a circuit configuration of a sensor device of a fifth embodiment.

A sensor device showing a fifth embodiment of the present invention will next be described with reference to FIG. 9. Incidentally, FIG. 9 is a circuit configuration of the sensor device of the fifth embodiment.

The sensor device of the fifth embodiment is basically identical in configuration to the sensor device of the fourth embodiment, but the following improvements are added thereto. In the present embodiment, an NMOS transistor 73 is provided in place of the diode 70. A source electrode of the NMOS transistor 73 is connected to the ground terminal Gnd, and drain, well and gate electrodes thereof are connected to the well electrodes of the MOS switches 5 and 6. By doing so, a diode element and a MOS transistor are substantially arranged in parallel between the ground terminal Gnd and the well electrodes of the MOS switches 5 and 6. Thus, when power is being normally supplied to the ground terminal Gnd, a more stable potential can be supplied by the well electrodes of the MOS switches 5 and 6.

DESCRIPTION OF REFERENCE NUMERALS

1 . . . sensor device, 2 . . . capacitor, 3 . . . diode, 4 to 7 . . . MOS switches, 8 . . . detection element, 9, 10 . . . MOS switch, 11 . . . capacitor, 12 to 17 . . . MOS switches, 18 . . . capacitor, 19 . . . operational amplifier, 20 . . . reference voltage source, 21 . . . output MOS transistor, 22 . . . power supply line, 23 . . . output line, 24 . . . ground line, 25 . . . control device, 26 . . . constant voltage source, 27 . . . pull-up resistor, 28 . . . sensor device, 29 . . . detection element, 30 to 33 . . . resistors, 34 . . . amplifier, 35 . . . reference power supply, 36 . . . output transistor, 37 . . . power supply line, 38 . . . output line, 39 . . . ground line, 40 . . . control device, 41 . . . constant voltage source, 42 . . . pull-up resistor, 43 . . . CMOS amplifier circuit, 44 . . . PMOS transistor, 45 . . . NMOS transistor, 46 . . . PMOS transistor, 47 . . . source electrode, 48 . . . gate electrode, 49 . . . drain electrode, 50 . . . well electrode, 51 . . . P type region, 52 . . . gate, 53 . . . P type region, 54 . . . N type region, 55 . . . N well region, 56 . . . resistor, 57 to 60 . . . MOS transistors, 61 . . . resistor, 62 . . . MOS transistor, 63 . . . resistor, 64 . . . NMOS transistor, 65 . . . resistor, 66 . . . MOS transistor, 67 . . . operational amplifier, 68 . . . output PMOS transistor, 69 . . . output NMOS transistor, 70 . . . diode, 71 . . . output PMOS transistor, 72 . . . pull-down resistor, 73 . . . NMOS transistor.

The invention claimed is:

1. A sensor device for detecting a predetermined physical quantity, the sensor device including a power supply terminal and a ground terminal which are supplied with power from outside, an output terminal which outputs an output signal of the sensor device to the outside as an analog voltage, and an output circuit which generates an output signal of the output terminal, the sensor device comprising:
   a series circuit of a MOS switch and a capacitor, the series circuit being arranged in a negative feedback part of the output circuit; and
   an element which serves as a diode connected to a well electrode of the MOS switch.

2. The sensor device according to claim 1, wherein the output circuit is an output circuit of an open drain type.

3. The sensor device according to claim 2, wherein the output circuit is an NMOS open drain circuit, and the element which serves as the diode takes a direction from the power supply terminal to the well electrode of the MOS switch as a forward direction.

4. The sensor device according to claim 3, wherein the element which serves as the diode comprises a PMOS transistor, and
a source electrode of the PMOS transistor is connected to the power supply terminal and drain, well and gate electrodes thereof are connected to the well electrode of the MOS switch.

5. The sensor device according to claim 2, wherein the output circuit is a PMOS open drain circuit, and the element which serves as the diode takes a direction from the well electrode of the MOS switch to the ground terminal as a forward direction.

6. The sensor device according to claim 5, wherein the element which serves as the diode comprises an NMOS transistor, and
a source electrode of the NMOS transistor is connected to the ground terminal and drain, well and gate electrodes thereof are connected to the well electrode of the MOS switch.

7. The sensor device according to claim 1, includes means for reducing a voltage between the power supply terminal and the ground terminal to a predetermined voltage or less when the power supply terminal or the ground terminal is opened,
voltage detecting means for detecting that the voltage between the power supply terminal and the ground terminal is reduced, and
a MOS transistor connected in parallel with the element serving as the diode turned on and off based on the output of the voltage detecting means.

8. The sensor device according to claim 1, includes means for reducing the voltage between the power supply terminal and the ground terminal to a predetermined voltage or less when the power supply terminal or the ground terminal is opened,
voltage detecting means for detecting that the voltage between the power supply terminal and the ground terminal is reduced, and
a transistor for controlling a voltage of the output terminal,
wherein a transistor on/off-operated based on the output of the voltage detecting means is connected to a well electrode of the transistor for controlling the voltage of the output terminal.

* * * * *